United States Patent [19]
Shiraishi

[11] 4,409,317
[45] Oct. 11, 1983

[54] RADIATION SENSITIVE COATING COMPOSITION

[75] Inventor: Hiroshi Shiraishi, Hachioji, Japan

[73] Assignee: Hitachi, Ltd., Tokyo, Japan

[21] Appl. No.: 420,878

[22] Filed: Sep. 21, 1982

[30] Foreign Application Priority Data

Sep. 24, 1981 [JP] Japan ................................ 56/149420

[51] Int. Cl.$^3$ ................................................ G03C 1/68
[52] U.S. Cl. ................................ 430/270; 204/159.14; 427/43.1; 430/296; 430/326
[58] Field of Search ............... 427/43.1; 430/270, 296, 430/326; 204/159.14

[56] References Cited

U.S. PATENT DOCUMENTS

| 3,935,331 | 1/1976 | Poliniak et al. | 430/326 |
| 4,267,257 | 5/1981 | Poliniak et al. | 430/326 |
| 4,289,845 | 9/1981 | Bowden et al. | 430/296 |

*Primary Examiner*—Jack P. Brammer
*Attorney, Agent, or Firm*—Antonelli, Terry & Wands

[57] ABSTRACT

A radiation sensitive coating composition comprising (a) an alkali soluble resin such as a phenolic resin, poly(p-vinylphenol) or a halogenated poly(p-vinylphenol), (b) poly(2-methylpentene-1-sulfone), and (c) a solvent containing isoamyl acetate as major component can give a positive-type radiation sensitive resist film with good compatibility of the resin components and other good properties.

8 Claims, No Drawings

RADIATION SENSITIVE COATING COMPOSITION

BACKGROUND OF THE INVENTION

This invention relates to a positive working radiation sensitive coating composition having high sensitivity to radiation such as electron beams, ion beams, X-rays, etc., particularly to a radiation sensitive coating composition suitable for forming a radiation sensitive resin film having good compatibility.

A process for producing semiconductor devices using a radiation sensitive composition comprising an alkali soluble novolak resin and poly(2-methylpentene-1-sulfone) is disclosed in Japanese Patent Appln Kokai (Laid-Open) No. 153578/79 but only a mixed solvent of methoxyethyl acetate and cyclohexane is disclosed therein as a solvent for such a composition.

In general, compatibility between poly(2-methylpentene-1-sulfone) and novolak resins is not so good. Thus, when a solution of the two is coated on a substrate and dried to form a coating film, it is found that phase separation of the two readily takes place and a coating film with homogeneous quality cannot be obtained. Since the resulting coating film is a positive type or positive working wherein portions exposed to radiation are solubilized to a developer, when the coating film is unhomogeneous, the exposed portions and unexposed portions only show a slight difference in solubilities to the developer. Therefore, the formation of homogeneous coating film from the above-mentioned two resin componenets has long been desired.

SUMMARY OF THE INVENTION

It is an object of this invention to provide a radiation sensitive coating composition containing as resin component an alkali soluble resin and poly(2-methylpentene-1-sulfone) and having good compatibility of the two resin components each other to give a homogeneous coating film with desirable properties.

This invention provides a radiation sensitive coating composition comprising (a) at least one alkali soluble resin selected from the group consisting of phenolic resins, poly(p-vinylphenol) and halogenated poly(p-vinylphenol)s, (b) poly(2-methylpentene-1-sulfone), and (c) isoamyl acetate or a mixture of 90 to 99.9% by volume of isoamyl acetate and 0.1 to 10% by volume of one or more solvents compatible with isoamyl acetate.

DETAILED DESCRIPTION OF PREFERRED EMBODIMENTS

As the alkali soluble resin, the component (a), there can be used a phenol novolak resin, cresol novolak resin and the like phenolic resins, poly(p-vinylphenol), and halogenated poly(p-vinylphenol)s such as brominated poly(p-vinylphenol). These alkali soluble resins can be used alone or as a mixture thereof.

As the component (b), poly(2-methylpentene-1-sulfone) preferably having a molecular weight of $1 \times 10^4$ to $1 \times 10^5$ measured by gel permeation chromatography is used. The component (b) is used in an amount of preferably 8 to 20% by weight, more preferably 10 to 20% by weight based on the weight of the alkali soluble resin. As will be explained in detail later, the coating film obtained from only poly(2-methylpentene-1-sulfone) is low in sensitivity. Thus when the proportion of poly(2-methylpentene-1-sulfone) in the radiation sensitive components i.e., the components (a) and (b), is too high, the sensitivity is lowered. But it is poly(2-methylpentene-1-sulfone) that decomposes by irradiation with radiation, so that this substance should be included in some amount so as to function as the positive working radiation sensitive composition. Therefore, it is preferable to use the component (b) in the above-mentioned range.

As is well known in this art, a blend of two kinds of polymers with good compatibility is not always formed among various combinations of polymers. Moreover, even in compatible combinations, blends with good compatibility are sometimes not obtained depending on preparation conditions due to generation of phase separation and the like. It is essential in this invention to use as solvent the component (c), isoamyl acetate, to give a homogeneous coating film with good compatibility of the resin components (a) and (b), when the resulting coating composition is coated on a substrate. The same preferable results can be obtained when a mixture of 99.9 to 90% by volume of isoamyl acetate and 0.1 to 10% by volume of one or more solvents compatible with isoamyl acetate is used. There is a general tendency to show better effects when the proportion of isoamyl acetate becomes larger.

Examples of the solvents compatible with isoamyl acetate are acetic acid esters such as n-amyl acetate, n-butyl acetate, isobutyl acetate, methyl Cellosolve acetate (ethylene glycol monomethyl ether acetate), ethyl Cellosolve acetate, etc., ketones such as cyclohexanone, methyl ethyl ketone, methyl isobutyl ketone, etc. These solvents may be used alone or as a mixture thereof.

The solid content, i.e., a total of the alkali soluble resin and poly(2-methylpentene-1-sulfone), is preferably 5 to 30% by weight, more preferably 10 to 20% by weight in the radiation sensitive coating composition comprising the components (a), (b) and (c). But such a solid content has no critical meaning, since it is obtained from the viewpoint of the viscosity of the coating composition suitable for coating.

Reasons for giving particularly excellent results in the case of using isoamyl acetate are that a homogeneous coating film of, for example, a halogenated poly(p-vinylphenol) or m- and p-cresol novolak resin and poly(2-methylpentene-1-sulfone) with excellent compatibility can be obtained from such a coating composition. These compatible resin blends show more excellent properties than the case of using other resins. This can be explained as follows.

As previously mentioned, the coating film of poly(2-methylpentene-1-sulfone) itself is low in sensitivity and does not decompose completely when exposed to a dose of several tens $\mu C/cm^2$. On the other hand, since the component (a) is a resin which is soluble in alkali, the portion which is not exposed to radiation, i.e. the portion which should not be dissolved, is dissolved to some extent by a developer, particularly when a concentrated aqueous alkaline solution is used as a developer. If the addition of a small amount of poly(2-methylpentent-1-sulfone) to the alkali soluble resin can change the solubility rate greatly, it can be said that the resulting resin blend has high performance. In other words, since a blend with a smaller proportion of poly(2-methylpentene-1-sulfone) has higher sensitivity, if the solubility rate of a blend having a small amount of poly(2-methylpentene-1-sulfone) becomes small, good results will be obtained since the difference in the solubility rate between the portion exposed to radiation, i.e., the portion wherein poly(2-methylpentene-1-sulfone) is decomposed, and the portion not exposed to radiation becomes large.

When the solubility rate of various resins is denoted as $T_0$ and that of individual blends with 10% by weight of poly(2-methylpentene-1-sulfone) as $T_{10}$, the ratio of $T_0/T_{10}$ with larger values brings about good results by the reason mentioned above. Table 1 shows the ratio of $T_0/T_{10}$ of various alkali soluble resins when an aqueous solution of tetramethyl ammonium is used as a solvent.

TABLE 1

| Resin | Manufacturer | $T_0T_{10}$ | Tetramethyl ammonium aqueous solution |
|---|---|---|---|
| Poly(p-vinylphenol) | Maruzene Oil Co., Ltd. | 3.6 | 1.3% |
| Brominated poly-(p-vinylphenol) | Maruzene Oil Co., Ltd. | 18.0 | 0.15% |
| Phenol novolak resin | Hoechst AG | 11.1 | 1.7% |
| Phenol novolak resin | Shinko Tech. & Research Co., Ltd. | 9.6 | 1.7% |
| m-Cresol novolak resin | Shinko Tech. & Research Co., Ltd. | 14.5 | 1.7% |
| m-Cresol novolak resin | Gunei Chemical Industry Co., Ltd. | 9.5 | 0.95% |
| m,p-Cresol novolak resin | Gunei Chemical Industry Co., Ltd. | 21.5 | 1.7% |
| o-Cresol novolak resin | Gunei Chemical Industry Co., Ltd. | 3.4 | 0.48% |

As shown in Table 1, the combinations of m,p-cresol novolak resin with poly(2-methylpentene-1-sulfone) and brominated poly(p-vinylphenol) with poly(2-methylpenten-1-sulfone) show particularly large values; this means that these blends show particularly excellent results due to good compatibility of the resin components. In table 1, the same kind of resins take slightly different values of $T_0/T_{10}$ dependent on manufacturers due to differences in physical and chemical properties such as molecular weight, etc.

When isoamyl acetate or a mixed solvent containing 90% by volume or more of isoamyl acetate is used as solvent for the components (a) and (b), the resulting coating composition gives a homogeneous coating film with good compatibility.

This invention is illustrated by way of the following Examples.

EXAMPLE 1

Three grams of m,p-cresol novolak resin (mfd. by Gunei Chemical Co., Ltd.) and 0.6 g of poly(2-methylpentene-1-sulfone) were dissolved in 20 ml of isoamyl acetate. After filtering the resulting solution with a tetrafluoroethylene resin filter having a pore size of 0.2 μm, the filtrate was spin coated on a silicon wafer at 2000 r.p.m. The resulting resist film had a film thickness of 1 μm with good compatibility of the resin components.

The silicon wafer coated with the resist film was heated at 80° C. for 10 minutes, exposed to electron beams with a dose of 3 $\mu C/cm^2$, heated again at 110° C. for 5 minutes and dipped in a 1.4% tetramethylammonium hydroxide aqueous solution for 5 minutes to give a good positive-type pattern.

EXAMPLE 2

Three grams of phenol novolak resin (mfd. by Hoechst AG) and 0.6 g of poly(2-methylpentene-1-sulfone) were dissolved in 20 ml of isoamyl acetate. After filtering the resulting solution with a tetrafluoroethylene resin filter having a pore size of 0.2 μm, the filtrate was spin coated on a silicon wafer at 2000 r.p.m. The resulting resist film had a film thickness of 1.1 μm with good compatibility of the resin components.

The silicon wafer coated with the resist film was heated at 80° C. for 10 minutes, exposed to electron beams with a dose of 5 $\mu C/cm^2$, heated again at 110° C. for 5 minutes and dipped in a 0.7% tetramethylammonium hydroxide solution for 7 minutes to give a good positive-type pattern.

EXAMPLE 3

A resist film of 1.2 μm thick with good compatibility was formed in the same manner as described in Example 2 except for using m-cresol novolak resin as the component (a).

A positive-type pattern with good properties was obtained in the same manner as described in Example 2 except for conducting the development by dipping in a 2.4% tetramethylammonium hydroxide aqueous solution for 9 minutes.

EXAMPLE 4

The process of Example 2 was repeated except for using poly(p-vinylphenol) (mfd. by Maruzen Oil Co., Ltd.) as the alkali soluble resin, using the spin coating conditions of 2500 r.p.m. and the dose of 8 $\mu C/cm^2$, and conducting the development by dipping in a 2.1% tetramethylammonium hydroxide aqueous solution for 2 minutes. The resulting positive-type pattern had good properties.

EXAMPLE 5

Using the same process as described in Example 2 except for using brominated poly(p-vinylphenol) as the alkali soluble resin, a resist film of 1.5 μm thick with good compatibility was obtained.

Treating the resulting resist film in the same manner as described in Example 2 except for using the dose of 8 $\mu C/cm^2$ and conducting the development by dipping in a 0.15% tetramethylammonium hydroxide aqueous solution for 10 minutes, there was obtained a positive-type pattern with good properties.

When a mixture of 95% by volume of isoamyl acetate and 5% by volume of a solvent compatible with isoamyl acetate such as n-butyl acetate or a mixture of 90% by volume of isoamyl acetate and 10% by volume of a solvent compatible with isoamyl acetate such as n-amyl acetate is used, the same good results as mentioned above are obtained.

As mentioned above, by using the special solvent (c), a positive working radiation sensitive resist film with good properties e.g. compatibility can be formed stably from a blend of an alkali soluble resin (the component (a)) and poly(2-methylpentene-1-sulfone) (the component (b)).

What is claimed is:

1. A radiation sensitive coating composition comprising (a) at least one alkali soluble resin selected from the group consisting of phenolic resins, poly(p-vinylphenol) and halogenated poly(p-vinylphenol)s,
(b) poly(2-methylpentene-1-sulfone), and
(c) isoamyl acetate or a mixture of 90 to 99.9% by volume of isoamyl acetate and 0.1 to 10% by volume of one or more solvents compatible with isoamyl acetate.

2. A composition according to claim 1, wherein the component (a) is m,p-cresol novolak resin.

3. A composition according to claim 1, wherein the component (a) is poly(p-vinylphenol).

4. A composition according to claim 1, wherein the component (a) is a halogenated poly(p-vinylphenol).

5. A composition according to claim 1, wherein the component (a) is m-cresol novolak resin.

6. A composition according to claim 1, 2, 3, 4 or 5, wherein the component (c) is isoamyl acetate.

7. A composition according to claim 1, wherein the total amount of the components (a) and (b) is 5 to 30% by weight, the amount of the component (c) is 95 to 70% by weight, and the amount of the component (b) is 8 to 20% by weight based on the weight of the component (a).

8. A composition according to claim 1, wherein the solvent compatible with isoamyl acetate is n-amyl acetate, n-butyl acetate, isobutyl acetate, ethylene glycol monomethyl ether acetate, ethyl Cellosolve acetate, cyclohexanone, methyl ethyl ketone, or methyl isobutyl, ketone.

* * * * *